(12) United States Patent
Shen et al.

(10) Patent No.: US 12,266,567 B2
(45) Date of Patent: *Apr. 1, 2025

(54) METHOD OF FORMING A BARRIER LAYER IN AN INTERCONNECT STRUCTURE OF SEMICONDUCTOR DEVICE

(71) Applicant: Taiwan Semiconductor Manufacturing Co., Ltd., Hsinchu (TW)

(72) Inventors: Bo-Jhih Shen, Tainan (TW); Yi-Wei Chiu, Kaohsiung (TW); Hung Jui Chang, Shetou Shiang (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 40 days.

This patent is subject to a terminal disclaimer.

(21) Appl. No.: 17/731,053

(22) Filed: Apr. 27, 2022

(65) Prior Publication Data

US 2022/0254682 A1   Aug. 11, 2022

Related U.S. Application Data

(60) Continuation of application No. 16/787,891, filed on Feb. 11, 2020, now Pat. No. 11,335,593, which is a
(Continued)

(51) Int. Cl.
*H01L 21/768* (2006.01)
*H01L 21/02* (2006.01)
(Continued)

(52) U.S. Cl.
CPC .. *H01L 21/76843* (2013.01); *H01L 21/02063* (2013.01); *H01L 21/2855* (2013.01);
(Continued)

(58) Field of Classification Search
CPC ......... H01L 21/76843; H01L 21/02063; H01L 21/2855; H01L 21/76804; H01L 21/76811;
(Continued)

(56) References Cited

U.S. PATENT DOCUMENTS 6,911,124 B2   6/2005 Tang et al.
7,968,506 B2   6/2011 Chou et al.
(Continued)

FOREIGN PATENT DOCUMENTS

JP   2002043246 A   2/2002
JP   2015073081 A   4/2015
JP   6056868 B2     1/2017

*Primary Examiner* — Nelson Garces
(74) *Attorney, Agent, or Firm* — Slater Matsil, LLP

(57) ABSTRACT

Implementations of the present disclosure provide methods for preventing contact damage or oxidation after via/trench opening formation. In one example, the method includes forming an opening in a structure on the substrate to expose a portion of a surface of an electrically conductive feature, and bombarding a surface of a mask layer of the structure using energy species formed from a plasma to release reactive species from the mask layer, wherein the released reactive species form a barrier layer on the exposed surface of the electrically conductive feature.

20 Claims, 6 Drawing Sheets

Related U.S. Application Data division of application No. 15/653,368, filed on Jul. 18, 2017, now Pat. No. 10,566,232.

(60) Provisional application No. 62/508,155, filed on May 18, 2017.

(51) Int. Cl.
*H01L 21/285* (2006.01)
*H01L 23/522* (2006.01)

(52) U.S. Cl.
CPC .. *H01L 21/76804* (2013.01); *H01L 21/76811* (2013.01); *H01L 21/76813* (2013.01); *H01L 21/76814* (2013.01); *H01L 21/76853* (2013.01); *H01L 23/5226* (2013.01)

(58) Field of Classification Search
CPC ......... H01L 21/76813; H01L 21/76814; H01L 21/76853; H01L 21/76831; H01L 21/76816; H01L 21/02052; H01L 21/3065; H01L 21/76807; H01L 21/76829; H01L 23/5226

See application file for complete search history.

(56) References Cited

U.S. PATENT DOCUMENTS

| | | |
|---|---|---|
| 9,245,789 B2 | 1/2016 | Okamoto et al. |
| 10,566,232 B2 * | 2/2020 | Shen ................. H01L 21/76813 |
| 2005/0233582 A1 * | 10/2005 | Friedemann ...... H01L 21/76843 |
| | | 438/672 |
| 2007/0126121 A1 | 6/2007 | Shue et al. |
| 2010/0055897 A1 * | 3/2010 | Chou ................ H01L 21/76814 |
| | | 438/638 |
| 2015/0262864 A1 * | 9/2015 | Okamoto .......... H01L 21/31144 |
| | | 438/671 |
| 2017/0053865 A1 | 2/2017 | Lin et al. |
| 2018/0294162 A1 * | 10/2018 | Xie ..................... C23C 14/3464 |

* cited by examiner

METHOD OF FORMING A BARRIER LAYER IN AN INTERCONNECT STRUCTURE OF SEMICONDUCTOR DEVICE

PRIORITY CLAIM AND CROSS-REFERENCE

This application is a continuation of U.S. patent application Ser. No. 16/787,891, filed on Feb. 11, 2020, entitled "Interconnect Structure of Semiconductor Device," which is a divisional of U.S. patent application Ser. No. 15/653,368, filed on Jul. 18, 2017, entitled "Post-Etch Treatment of an Electrically Conductive Feature," now U.S. Pat. No. 10,566,232 issued on Feb. 18, 2020, which claims the benefit of U.S. Provisional Application No. 62/508,155, filed on May 18, 2017, which applications are hereby incorporated herein by reference.

BACKGROUND

The use of copper as a conductive interconnect material is favored in semiconductor devices because of the high speed provided by copper. Copper is difficult to pattern and therefore damascene processing technology has been adapted by the industry to form copper interconnect contacts. A typical damascene process may include forming an opening in a dielectric layer, depositing copper over the dielectric layer and within the opening, and then performing a planarization process to remove excess copper over the dielectric layer, leaving the copper inlaid within the opening. Optionally, an etch stop layer is formed on the top surfaces of the copper and the dielectric layer. Thereafter, an upper dielectric layer and a photoresist layer are sequentially formed on the etch stop layer. Lithography and etching techniques are then used to form an opening in the upper dielectric layer and the etch stop layer, exposing an underlying portion of the copper for the purpose of electrical connection.

A challenge associated with the above processes is that the etching process used to etch the via would leave etching residues and by-products. The exposed copper surfaces are prone to oxidation due to these etching residues and by-products, which in turn degrades the quality of the exposed copper surface and increases contact resistance. While a wet cleaning process can be used to remove copper oxides, the wet cleaning process would cause damage to the copper surface.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
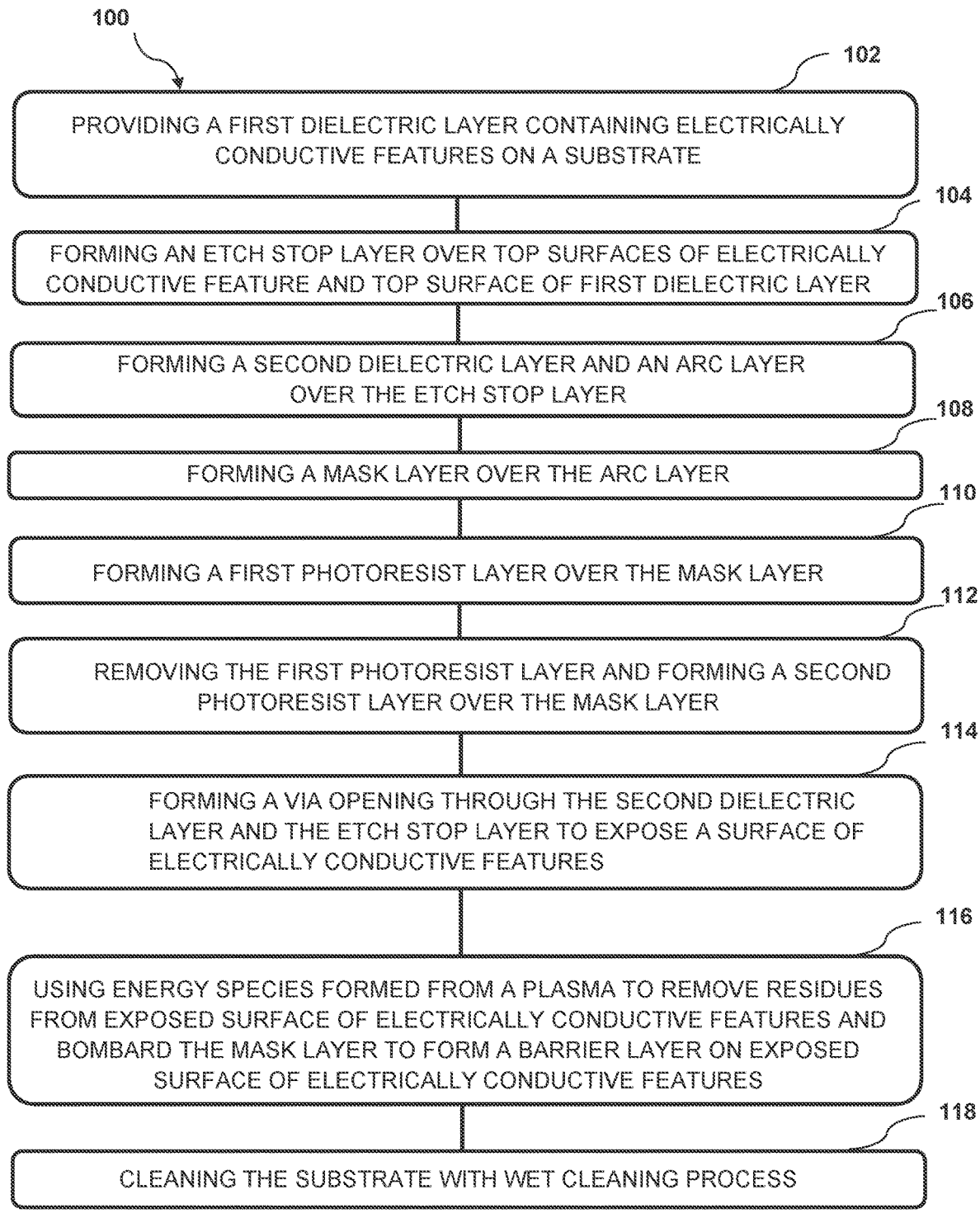
FIG. 1 is a flow chart illustrating an exemplary method for fabricating an interconnect structure of a semiconductor device according to various implementations of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flow chart 100 illustrating an exemplary method for fabricating an interconnect structure of a semiconductor device according to various implementations of the present disclosure. FIGS. 2A to 2E illustrate cross-sectional views of the semiconductor device at various stages of fabrication according to the flow chart of FIG. 1. Those skilled in the art should recognize that the full process for forming a semiconductor device and the associated structures are not illustrated in the drawings or described herein. Although various operations are illustrated in the drawings and described herein, no limitation regarding the order of such steps or the presence or absence of intervening steps is implied. Operations depicted or described as sequential are, unless explicitly specified, merely done so for purposes of explanation without precluding the possibility that the respective steps are actually performed in concurrent or overlapping manner, at least partially if not entirely.

The flow chart 100 begins at operation 102 by providing an interconnect structure of a semiconductor device 200. The interconnect structure of the semiconductor device 200 may include a first dielectric layer 210 containing electrically conductive features 205 formed over a substrate 202. The interconnect structure of the semiconductor device 200 could be a multi-layered structure at various stages of fabrication of integrated circuits (ICs). For example, the interconnect structure of the semiconductor device 200 may be a portion of a back end of the line (BEOL) interconnect structure where individual devices or components are interconnected with wiring or metal layers. It is noted that additional structures, material layers, or device structures may be pre-formed on the substrate prior to forming the interconnection structure thereon so as to facilitate operation and proper functioning of the semiconductor device 200. For example, a front end structure, such as gate structures, contact structures, or other suitable structures may be pre-formed on the substrate 202 prior to forming the interconnection structure as needed.

Figure 2A:
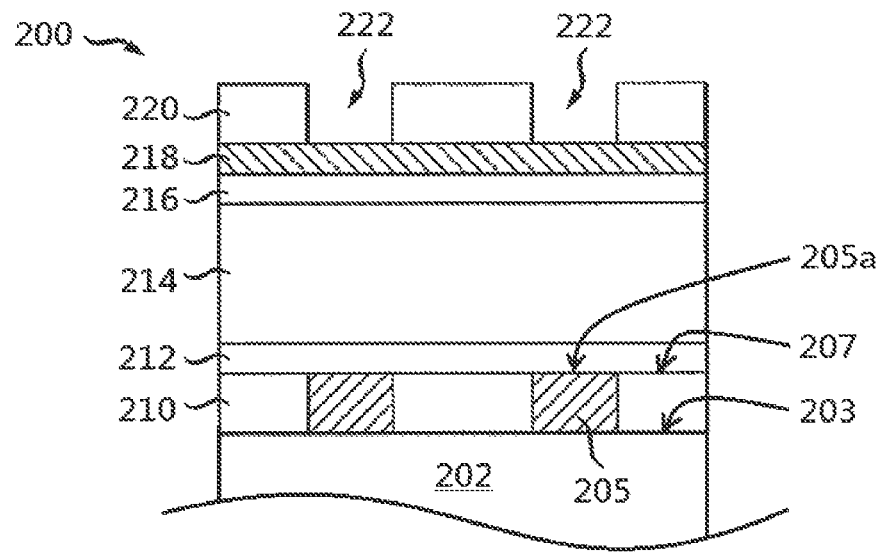
FIGS. 2A to 2E illustrate cross-sectional views of a semiconductor device at various stages of fabrication according to various implementations of the present disclosure.

The electrically conductive features 205 may be formed in the first dielectric layer 210 using any suitable technique, such as a damascene process. The interconnect structure of the semiconductor device 200 is then subjected to a polishing process, such as a chemical mechanical polish (CMP) process, so that the top surfaces 205*a* of the electrically conductive features 205 and the top surface 207 of the first dielectric layer 210 are at substantially the same height, as shown in FIG. 2A. The electrically conductive features 205 may be formed of a metal, a metal alloy, a transition metal, a transition metal alloy, or the like. For example, the electrically conductive features 205 may be formed of copper, aluminum, gold, tungsten, etc. In other examples, the electrically conductive features 205 are formed of copper, copper-containing metal, copper alloy or copper-containing alloy. In one example, the electrically conductive features 205 are made of copper.

The first dielectric layer 210 may be one or more layers of any suitable dielectric material used in semiconductor manufacturing. For example, the first dielectric layer 210 may be a single layer including an oxide, a nitride, low-k material, silicon carbon containing material or other suitable dielectric material. In some examples, the first dielectric layer 210 is a layer stack including an oxide, a nitride, low-k or other suitable dielectric material. Exemplary materials for the first dielectric layer 210 include, but are not limited to, silicon oxide, aluminum oxide, silicon carbide, carbon doped silicon oxides, silicon nitride, silicon oxynitride, amorphous carbon, and any combination thereof.

It is contemplated that the terms "over" or "on" used in this disclosure is intended to denote a first element being adjacent to, but not necessarily adjoining, a surface of a second element. Therefore, while the first dielectric layer 210 is being described as formed over the substrate 202, one or more intervening layers may exist between a surface of the substrate 202 and the first dielectric layer 210. For example, the first dielectric layer 210 may be formed adjacent to, but not necessarily adjoining, the top surface 203 of the substrate 202. Alternatively, the first dielectric layer 210 may be formed adjoining to the top surface 203 of the substrate 202, as shown in FIG. 2A.

The term "substrate" used herein is intended to broadly cover any object that can be processed in a process chamber. For example, the substrate 202 may be any substrate capable of having material deposited thereon, such as a silicon substrate, for example silicon (doped or undoped), crystalline silicon (e.g., Si<100> or Si<111>), silicon oxide, doped or undoped polysilicon, or the like, a germanium substrate, a silicon germanium (SiGe) substrate, a III-V compound substrate, such as a gallium arsenide substrate, a silicon carbide (SiC) substrate, a patterned or non-patterned semiconductor-on-insulator (SOI) substrate, a carbon doped oxide, a silicon nitride, a display substrate such as a liquid crystal display (LCD), a plasma display, an electro luminescence (EL) lamp display, a solar array, solar panel, a light emitting diode (LED) substrate, glass, sapphire, or any other materials such as metals, metal alloys, and other conductive materials. One or more electrical devices such as various N-type metal-oxide semiconductor (NMOS) and/or P-type metal-oxide semiconductor (PMOS) devices, such as transistors, capacitors, resistors, diodes, photo-diodes, fuses, and the like, could be formed in the substrate 202. The substrate 202 could be a layer in a multi-level interconnect scheme. It is contemplated that the substrate 202 is not limited to any particular size or shape. Therefore, the substrate 202 may be a circular substrate having a 200 mm diameter, a 300 mm diameter or other diameters, such as 450 mm, among others. The substrate 202 may also be any polygonal, square, rectangular, curved or otherwise non-circular workpiece.

At operation 104, an etch stop layer 212 is formed over the top surfaces 205*a* of the electrically conductive features 205 and the top surface 207 of the first dielectric layer 210, as shown in FIG. 2A. The etch stop layer 212 protects any underlying layer or layers during the etching process. The etch stop layer 212 may be formed using any suitable technique, such as a physical vapor deposition (PVD), atomic layer deposition (ALD), chemical vapor deposition (CVD) or plasma enhanced chemical vapor deposition (PECVD). The etch stop layer 212 is chosen to have different etching characteristics than a second dielectric layer 214 to be subsequently formed over the etch stop layer 212. Suitable materials for the etch stop layer 212 include silicon nitride, silicon carbide, silicon oxycarbide, nitrogen-doped silicon carbide, silicon oxynitride, silicon oxide, a metal oxide such as hafnium oxide or aluminum oxide, and any combination thereof. It is contemplated that while the etch stop layer 212 is shown as a single layer, the etch stop layer 212 may be a layer stack including two or more layers of the materials discussed herein.

At operation 106, a second dielectric layer 214 and an anti-reflective coating layer (ARC) 216 are formed in sequence over the etch stop layer 212, as shown in FIG. 2A. The second dielectric layer 214 may be used as an insulating layer. The second dielectric layer 214 may be a low dielectric constant (low-k) layer that has a dielectric constant of less than about 3.9, for example about 3.2 or less. In some implementations, the second dielectric material 214 is an ultra low-k material, such as a dielectric material having a dielectric constant of less than 2.5. Suitable materials for the second dielectric layer 214 include, but are not limited to, carbon-doped silicon oxide (e.g., silicon oxycarbide (SiOC), also referred to as organosilicate glass (OSG)), undoped silicate glass (USG), fluorinated silicate glass (FSG), phosphosilicate glass (PSG), borophosphosilicate glass (BPSG), tetraethyl orthosilicate (TEOS) based oxide, spin-on glass (SOG), organic polymer, and any combination thereof. In a case where the etch stop layer 212 is silicon carbide, the second dielectric layer 214 could be, for example, silicon oxycarbide or other material mentioned above that has different resistance to etchants used in the subsequent processes.

The anti-reflective coating layer 216 is used to suppress or minimize reflections from the underlying layers which are reflective to ultraviolet light used in the subsequent lithographic process. Exemplary materials for the anti-reflective coating layer 216 include silicon oxide, silicon oxycarbide, silicon oxynitride, hydrocarbon-containing silicon oxide, silicon nitride, titanium nitride, tantalum nitride, titanium containing material, an organic material, and any combination thereof. In some implementations, the anti-reflective coating layer 216 is a nitrogen-free material, such as a nitrogen-free oxide. In one implementation, the anti-reflective coating layer 216 is a nitrogen-free silicon oxycarbide. The anti-reflective coating layer 216 may be formed over the second dielectric layer 214 using any suitable technique, such as CVD, PECVD, high-density plasma CVD (HDP-CVD), or spin-on coating process, etc. A planarization process, such as a CMP process, may be performed to planarize the second dielectric layer 214 and/or the anti-reflective coating layer 216.

At operation 108, a mask layer 218 is formed over the anti-reflective coating layer 216, as shown in FIG. 2A. The mask layer 218 may include conductive material, such as basic metals or alloys thereof, transition metals, transition metal compounds or alloys thereof, nitride metal silicides, or metal silicides. The use of the metallic mask layer enhances etch resistance and hardness. As will be discussed in more detail below, the mask layer 218 can also be used as a material source for deposition of a barrier layer on the exposed top surface 205b of the electrically conductive feature 205. In one implementation, the mask layer 218 is formed of transition metal compounds, for example, transition metal nitrides or transition metal carbides. Exemplary transition metal include any element selected from group 3 to group 12 in the periodic table of elements, for example, titanium (Ti), manganese (Mn), iron (Fe), cobalt (Co), nickel (Ni), zinc (Zn), zirconium (Zr), molybdenum (Mo), ruthenium (Ru), tungsten (W), platinum (Pt), and tantalum (Ta), etc. Examples of transition metal nitrides include titanium nitride (TiN), tungsten nitride (WN), or tantalum nitride (TaN), etc. Examples of transition metal carbides include titanium carbide (TiC), tungsten carbide (WC), or tantalum carbide (TaC). The mask layer 218 may be formed by any suitable technique, such as CVD, PECVD, HDP-CVD, low-pressure CVD (LPCVD), atomic layer deposition (ALD), or physical vapor deposition (PVD), etc.

It should be noted that while the term "mask layer" is used in this disclosure, any layer that has a hardness and etch resistance and/or is capable of functioning as a hard-mask layer, a capping layer, a protecting layer, or an etch stop layer to protect underlying layers can also be used.

Figure 2B:
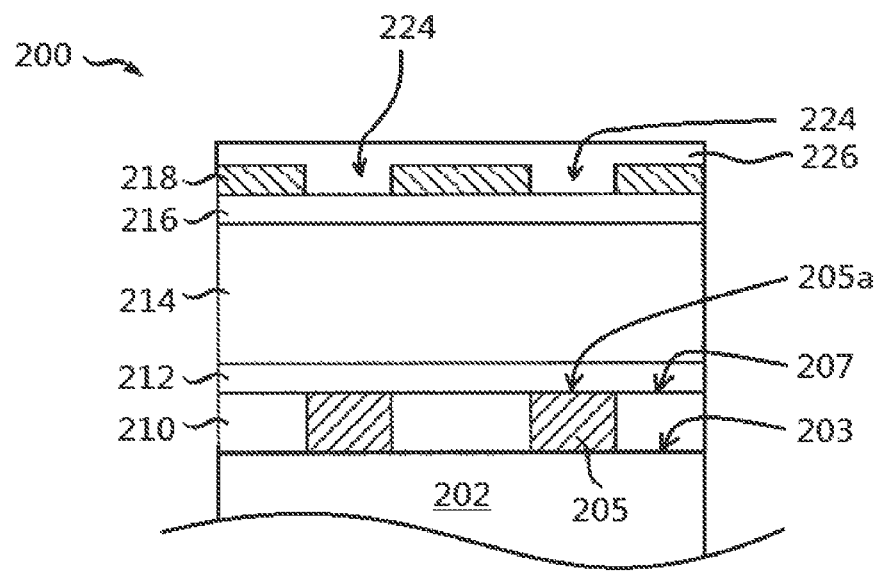

At operation 110, a first photoresist layer 220 is formed over the mask layer 218 to form pattern features 222 using a photolithography technique, as shown in FIG. 2A. The pattern features 222 are substantially aligned with the electrically conductive features 205, respectively. The pattern features 222 are transferred through the thickness of the mask layer 218 using a suitable etching process. The anti-reflective coating layer 216 can be used as an etch stop for the etching process. Upon completion of the etching process, pattern openings 224 are formed in the mask layer 218, as shown in FIG. 2B. The first photoresist layer 220 is then stripped by a wet or dry stripping process.

Figure 2C:
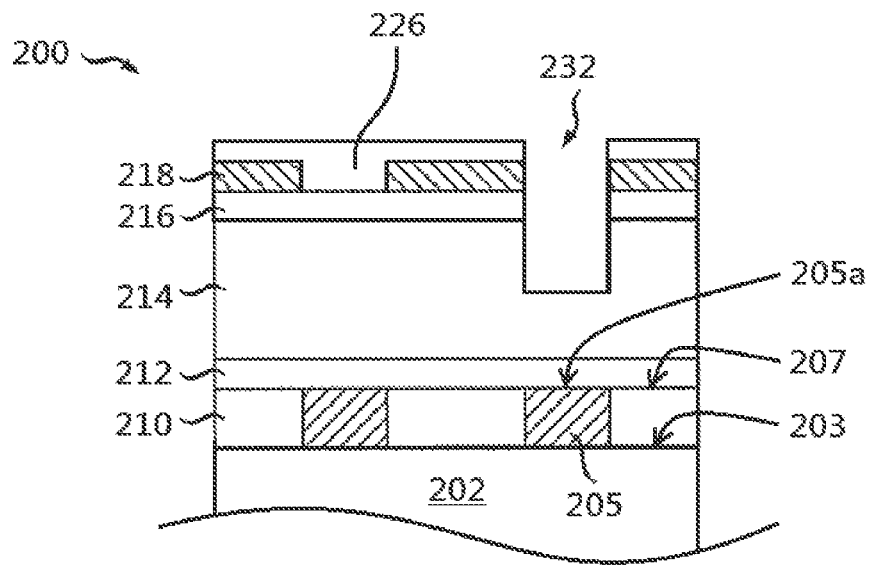

At operation 112, a second photoresist layer 226 is formed over the mask layer 218, as shown in FIG. 2B. The second photoresist layer 226 is formed within the pattern openings 224 and over the top surface of the mask layer 218. The second photoresist layer 226 defines trench patterns substantially aligned over the electrically conductive features 205. The second photoresist layer 226 may be any photoresist material suitable for transferring trench patterns into the underlying layers. For example, the second photoresist layer 226 may be a tri-layer mask having a bottom layer, a middle layer, and a top layer. The bottom layer may be a carbon organic layer. The middle layer may be a silicon-containing carbon layer used to help pattern the bottom layer. The top layer may be any suitable photoresist material designed for exposure to 193 nm or 157 nm wavelength. A suitable etching process, such as an anisotropic dry etching process, may be used to form a trench opening 232 into the anti-reflective coating layer 216 and partially into the second dielectric layer 214, as shown in FIG. 2C. The etching process may be timed to achieve the desired depth of the trench opening in the second dielectric layer 214. The second photoresist layer 226 is then removed using any suitable stripping process.

Figure 2D:
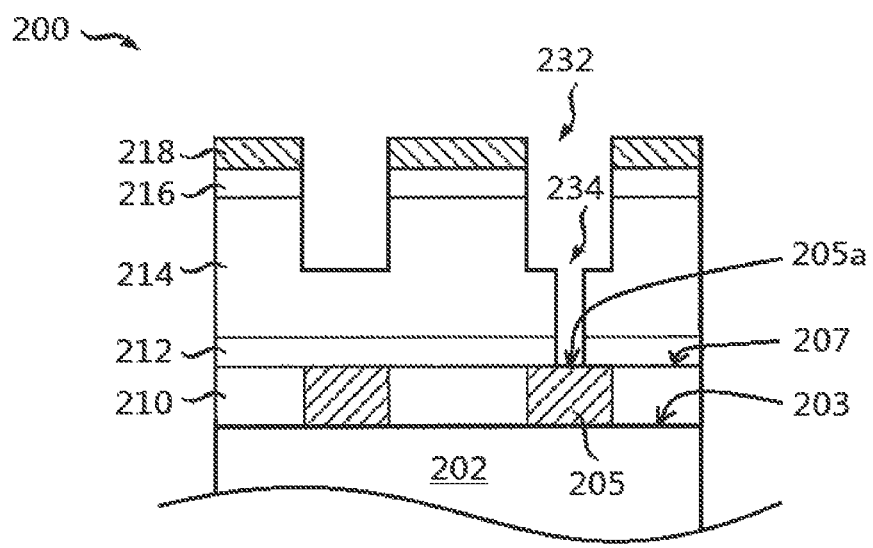

At operation 114, a via opening 234 is formed through the second dielectric layer 214 and the etch stop layer 212, as shown in FIG. 2D. The via opening 234 can be formed using a patterned photoresist layer that defines a via pattern that is substantially aligned with, but having a lateral width narrower than that of the trench pattern as a mask, followed by a suitable etching process. The etching process uses etchant gas mixtures and plasma parameters that are optimized to etch the etch stop layer 212 with minimum over-etch. For the sake of clarity, only one via opening 234 is shown extending from the trench opening 232 to the electrically conductive features 205. The patterned photoresist layer is then removed using any suitable stripping process. It should be understood that while a trench first via last (TFVL) approach is discussed herein, the concept of the present disclosure is also applicable to via first trench last (VFTL) approach. The terms "trench" and "via" used in the present disclosure may broadly cover any topographic features such as "opening," "holes," "recesses," "plugs," etc., that are suitable for providing a conductive or contact path which extend horizontally and/or vertically within the semiconductor device 200.

In one implementation, the via opening 234 has a height dimension of about 50 angstrom to about 2000 angstrom, such as about 100 angstrom to about 1200 angstrom and about 200 angstrom to about 800 angstrom. In some implementations, the aspect ratio of the via opening 234 is about 1:1, about 2:1, about 3:1, about 5:1, about 10:1, about 15:1, about 20:1, about 30:1, about 50:1, about 100:1 or above. In one implementation, the aspect ratio of the via opening 234 is about 10:1 to about 30:1, for example about 20:1. The term "aspect ratio" refers to the ratio of the height dimension to the width dimension of a particular feature, for example, via height/via width of the via opening 234.

The via opening 234 exposes a portion of the top surface 205a of the electrically conductive features 205 to provide an electrical connection thereto. While the etching process is optimized to etch the etch stop layer 212 with minimum over-etch, the top surface 205a of the electrically conductive features 205 is often damaged due to over-etch. The etching process may use a fluorocarbon containing etchant gas, which may result in polymeric residues and etch by-products formed on the exposed top surface 205b (see below, FIG. 3) of the electrically conductive features 205. These polymeric residues and by-products may degrade the quality of the exposed top surface 205b of the electrically conductive features 205 and undesirably increase contact resistance. Particularly, the exposed top surface 205b with the polymeric residues and by-products are prone to oxidation after a wet or dry cleaning process. Typical polymeric etch residues and by-products may include fluorine (F), carbon (C), copper (Cu), and other species in various combinations. For example, various $C_xF_y$, $CuF_x$, $CuO_x$ compounds or polymers may be produced on the exposed top surface 205b of the electrically conductive features 205 by reaction of the fluorocarbon etchant gases with the freshly exposed copper of the top surface 205b.

At operation 116, the semiconductor device 200 is subjected to a post-etch treatment in a process chamber. The post-etch treatment utilizes high energy species 238, 240 formed from a plasma 231 containing an inert gas and an etchant gas to remove etch residues or by-products found on the exposed top surface 205b of the electrically conductive features 205. The post-etch treatment process also involves bombarding the mask layer 218 with the high energy species 238, 240 to release reactive species from the mask layer 218. Some of these reactive species are re-deposited on the exposed top surface 205b of the electrically conductive features 205 to form a barrier layer 236. In some implementations, the material of the barrier layer 236 deposited on the exposed top surface 205b is mainly dependent on the material of the mask layer 218.

The term "species" described in this disclosure may refer to ionized species, radical species, and/or neutral species that are found in a plasma. In addition, while the post-etch treatment is described as being performed on the mask layer 218 to create reactive species, the post-etch treatment can be also be performed on any layer in an interconnect structure that has the desired composition for the barrier layer 236, or has a desired composition and can function as a mask layer, capping layer, shielding layer, blocking layer, encapsulating layer, etch stop layer, anti-reflective layer, etc.

In various implementations, the plasma 231 is formed from a gas mixture of a first gas containing an inert gas and a second gas containing an etchant gas. Suitable inert gases include, but are not limited to, helium (He), neon (Ne), argon (Ar), krypton (Kr), xenon (Xe), and any combination thereof. Suitable etchant gases include, but are not limited to, a hydrogen-containing gas such as hydrogen ($H_2$) or ammonia ($NH_3$), an oxygen-containing gas such as carbon dioxide ($CO_2$), carbon monoxide (CO), oxygen ($O_2$), ozone ($O_3$), a nitrogen-containing gas such as nitrogen ($N_2$), nitrous oxide ($N_2O$), nitric oxide (NO), nitrogen dioxide ($NO_2$), ammonia ($NH_3$), and any combination thereof. In one implementation, the inert gas selected as the first gas is, in an ionized state, chemically inert to the mask layer 218 while being capable of bombarding the surface of the mask layer 218 with controlled ion energy to release reactive species from the mask layer 218, with or without the help of the etchant gas from the second gas. In one implementation, the etchant gas selected as the second gas is, in an ionized state, able to chemically and/or physically remove residues and by-products from the exposed top surface 205b of the electrically conductive feature 205. The ionized etchant is also capable of bombarding the surface of the mask layer 218 with controlled ion energy to release reactive species from the mask layer 218.

The plasma 231 may be formed from the first gas and the second gas listed above in any combination. In various implementations, the first gas is an inert gas with relatively higher molecular weight such as argon (Ar), krypton (Kr), or xenon (Xe) etc., and the second gas can be any suitable gas having etching or bombarding capability, such as a hydrogen-containing gas, a nitrogen-containing gas, an oxygen-containing gas, and combinations thereof. For example, in one implementation, the first gas includes Ar and the second gas includes $N_2$. In one implementation, the first gas includes Ar and the second gas includes $NH_3$. In one implementation, the first gas includes Ar and the second gas includes $N_2$ and $NH_3$. In one implementation, the first gas includes Ar and the second gas includes $NO_2$. In one implementation, the first gas includes Ar and the second gas includes $N_2$ and $H_2$. In one implementation, the first gas includes Ar and the second gas includes $N_2$ and CO. In one implementation, the first gas includes Ar and the second gas includes $N_2$, CO, and $H_2$. In one implementation, the first gas includes Ar and the second gas includes $N_2$ and $CO_2$. In one implementation, the first gas includes Ar and the second gas includes $N_2$, $NH_3$, and CO. These exemplary implementations are found to be effective when the mask layer 218 is formed of transition metal compounds, for example transition metal nitrides. However, it is understood that these implementations are listed as examples because first and second gases may vary depending on the residues and by-products to be removed or materials of the mask layer to be bombarded.

Figure 2E:
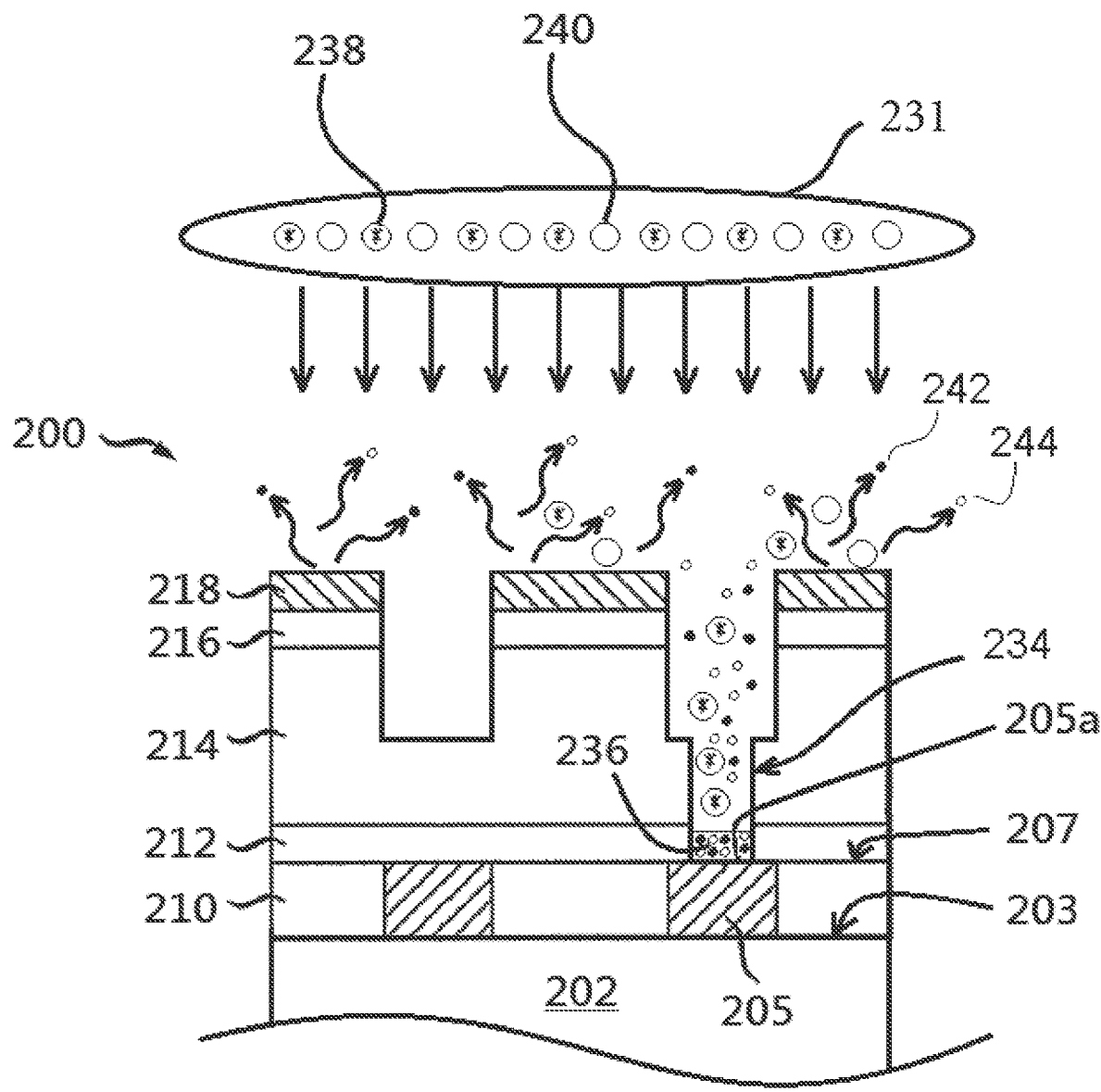

FIG. 2E illustrates reactions occurred on the semiconductor device 200 during the post-etch treatment according to implementations of the present disclosure. For the purposes of explanation, a Ti-containing material, such as TiN, will be used as an example for the mask layer 218. It is contemplated that the post-etch treatment is also applicable to any material used for the mask layer 218, such as TiSiN, a Ta-containing material, for example TaN, TaSiN, a W-containing material, for example WN, or any material suitable for the mask layer 218 as discussed above with respect to FIG. 2A. During the post-etch treatment, the semiconductor device 200 is exposed to ionized first and second gases from the plasma 231. Some high energy species from the plasma 231, for example species 238, are directed toward and react with the etch residues or by-products on the exposed top surface 205b of the electrically conductive features 205. In one implementation, species 238 are formed from an etchant gas such as a nitrogen gas. The nitrogen species from the plasma react with etch by-products, for example copper fluoride ($CuF_2$), to release $NF_x$ in gaseous form while reducing $CuF_2$ to Cu. Other high energy species, for example species 240 and species 238, bombard the TiN mask layer 218 to release reactive species 242, 244. In one implementation, species 240 are formed from an inert gas such as argon. Reactive species 242, 244 released from the TiN mask layer include nitrogen species 242 and Ti species 244. The nitrogen species 242 from the TiN mask, similar to the nitrogen species 238 from the plasma, chemically react with the etch residues or by-products, for example copper fluoride ($CuF_2$), to release $NF_x$ in gaseous form, which may be pumped from the process chamber while reducing $CuF_2$ to Cu metal.

The Ti species 244 react with the nitrogen species 238 from the plasma and/or nitrogen species 242 released from the TiN mask layer 218 to form TiN, some of which are deposited on the exposed top surface 205b of the electrically conductive features 205. Ti species 244 and nitrogen species 238, 242 are preferentially directed to the exposed top surface 205b of the electrically conductive features 205 due to gravity and/or bias power applied to the substrate support on which the semiconductor device 200 is disposed, thereby forming a TiN barrier layer 236 on the exposed top surface 205b. The TiN barrier layer 236 caps or seals the exposed top surface 205b of the electrically conductive features 205.

Therefore, the post-etch treatment utilizes a material existing in the mask layer 218 to form a barrier layer on the exposed top surface 205b. The materials potentially or intentionally to be bombarded off the mask layer 218 are controlled in a manner to be reformed at desired locations to provide barrier function as well as electrical improvement layer. Particularly, the barrier layer 236 prevents the exposed top surface 205b of the electrically conductive features 205 from oxidization and from damage that would otherwise occur to the exposed top surface 205b in the subsequent processes if no barrier layer 236 were presented. As a result, the quality of the contact surface (e.g., copper surface) is enhanced for better electrical performance. While bombarding, the residues are also removed. Etch residues or by-products remaining on the exposed top surface 205b is sealed or capped by the barrier layer 236. In addition, etch residues or by-products that are re-deposited on the barrier layer 236 and/or along the sidewalls of the via opening 234 can be easily removed in the subsequent wet cleaning process.

Figure 3:
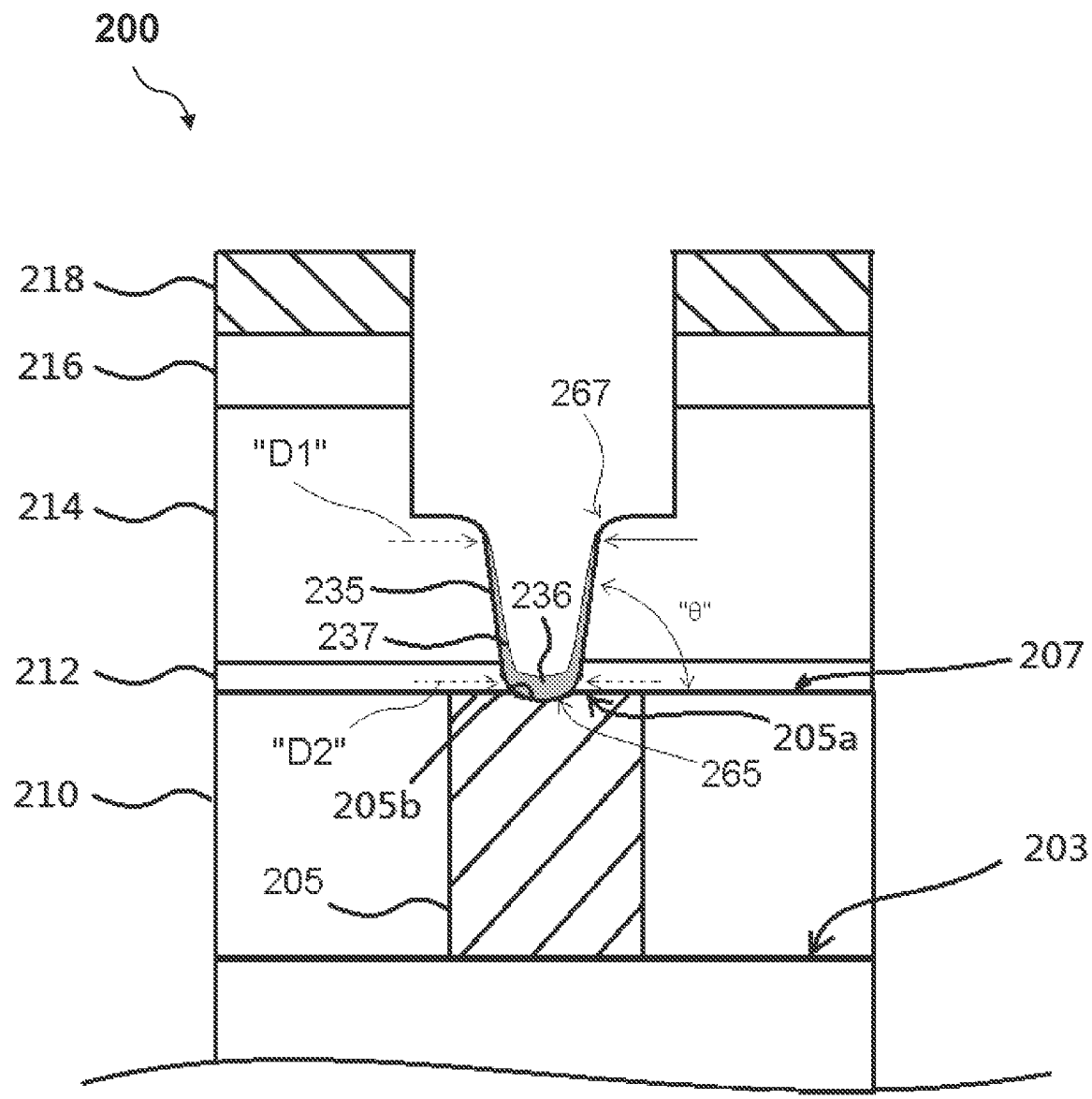
FIG. 3 illustrates an enlarged cross-sectional view of a semiconductor device with a barrier layer formed on the bottom and sidewalls of a via according to various implementations of the present disclosure.

A bias power may be applied to a substrate bias device of the process chamber during the post-etch treatment to help attract the high energy species 238, 240 and the reactive species 242, 244 toward the semiconductor device 200 and react at or near the exposed top surface 205b of the electrically conductive features 205. The bias power helps bombard the top surface of the mask layer 218 with minimum reaction to the sidewall of the dielectric layer. Therefore, while the TiN formed from the reaction of the Ti species and N species are deposited predominantly on the exposed top surface 205b, only a minimal amount of TiN are deposited along the sidewalls of the via opening 234. FIG. 3 illustrates the barrier layer 237 deposited on the sidewalls 235 of the via opening 234 is relatively less than the barrier layer 236 deposited at the bottom of the via opening 234. The preference for the bottom of the via pattern is also due to the majority of the nitrogen species being used to react with the polymeric etch residues or by-products that located at the bottom of the via opening 234. As a result, the barrier layer 237 on the sidewalls 235 of the via opening 234 is limited to a minimum level. In one implementation, the barrier layer 236 has a thickness of about 10 Angstroms to about 100 Angstroms, such as about 20 Angstroms to about 80 Angstroms, for example about 50 Angstroms. In some implementations, the ratio of the amount of the barrier layer 236 at the bottom (e.g., the exposed surface 205b) to the amount of the barrier layer 237 on the sidewalls 235 may be between about 1:0.01 and about 1:0.3, for example about 1:0.1 to about 1:0.2, after the post-etch treatment.

The first gas and the second gas may flow separately or pre-mixed into a plasma reactor where the plasma is produced. The plasma reactor may be disposed in a process chamber in which the substrate is disposed, or disposed remotely from the process chamber. The plasma reactor may be any suitable reactor that has separate controls for power input to a plasma source generator and to a substrate bias device. In one implementation, the plasma reactor is an inductively coupled plasma (ICP) reactor. In such a case, the plasma reactor may have a plasma source controller controlling the supply of inductively coupled RF power which determines plasma density (source power), and a bias controller controlling the supply of RF power or DC power which is used to generate a bias voltage on the substrate surface (bias power). The bias voltage can be used to control the bombardment energy of the high energy species 238, 240 on the substrate surface, such as the surface of the mask layer 218 and/or the exposed top surface 205b of the electrically conductive features 205 discussed above. While the ICP reactor is used in this disclosure as an example for forming the plasma, it is contemplated that other plasma source, such as a capacitively coupled plasma (CCP) source, a decoupled plasma source (DPS), a magnetron plasma source, an electron cyclotron resonance (ECR) source, or a microwave plasma source, may also be used.

In cases where an ICP reactor is used, the following chamber process parameters may be used to perform the post-etch treatment. These parameters can be used to treat a mask layer discussed in this disclosure, such as a mask layer formed of transition metal compounds, for example transition metal nitrides. In various implementations, the reactor pressure may be about 1 milli-Torr (mTorr) to about 10 Torr, such as about 10 mTorr to about 1 Torr, for example about 20 mTorr to about 60 mTorr. The source power may be about 50 watts (W) to about 650 W, such as about 100 W to about 500 W, for example about 250 W to about 450 W. The source power may be applied at a radio frequency (RF) range of about 30 MHz to about 60 MHz. The bias power provided to a substrate support of the ICP reactor may be about 10 W to about 450 W, such as about 50 W to about 300 W, for example 100 W to about 200 W. The bias power may be applied at a RF range of about 10 MHz to about 30 MHz. The substrate temperature may be about 450° C. or less, such as about 200° C. or less, 150° C. or less, 100° C. or less, 80° C. or less, 50° C. or less, for example about 23° C. to about 30° C. The gas flow of the first gas may be about 60 sccm to about 5000, such as about 100 sccm to about 2200 sccm, for example about 300 sccm to about 1000 sccm. The gas flow of the second gas may be about 5 sccm to about 250 sccm, such as about 10 sccm to about 150 sccm, for example about 20 sccm to about 100 sccm. The treatment time may be about 10 seconds to about 120 seconds, such as about 20 seconds to about 60 seconds, for example about 25 seconds to about 35 seconds. The process parameters discussed herein are based on a 300 mm substrate. It is contemplated that these process parameters may vary depending upon the thickness of the mask layer, the size of the via openings, the size of the substrate, the capability of the plasma reactor, and the application, etc.

In some implementations, the first gas is flowed into the plasma reactor at a first volumetric flowrate, and the second gas is flowed into the plasma reactor at a second volumetric flowrate, and a ratio of the first volumetric flowrate to the second volumetric flowrate can be controlled at between 3:1 and about 40:1, such as about 6:1 to about 30:1, for example about 9.1:1 to about 20.6:1. The flowrate of the first gas may be adjusted to control the bottom profile of the via opening 234. For example, the flowrate of the first gas containing an inert gas may be maintained at about 600 sccm or above to obtain a concave bottom 265 (see FIG. 3). The flowrate of the first gas containing an inert gas may be maintained at below 600 sccm to obtain a convex bottom of the via opening 234.

The voltage used during the post-etch treatment can change the profile of the via opening 234 and radially expand the exposed top surface 205b of the electrically conductive feature 205. For example, in an ICP reactor, the power level of the source power and the bias power can be provided at a ratio to control the bombardment of the high energy species on the upper corner 267 of the via opening 234. In various implementations, the source power is provided at a first power level and the bias power is provided at a second power level, and a ratio of the first power level to the second power level may be between about 1:1 and about 30:1, such as about 1.2:1 to about 12:1, for example about 1.5:1 to about 5.9:1. It has been observed that an ICP reactor providing a source power and a bias power at a ratio of source power to bias power of about 1.2:1 to about 12:1, particularly about 1.5:1 to about 5.9:1 will supply sufficient bombarding energy that can effectively shape or trim the upper corner 267 of the via opening 234 from a rough profile to a smooth and rounded profile, as shown in FIG. 3.

Likewise, the power level of the source power and the bias power can be adjusted to control the bombardment of the high energy species at joining corners between the exposed top surface 205b of the electrically conductive feature 205 and the sidewall 235 of the via opening 234, thereby expanding the lateral dimension of the exposed top surface 205b to provide a greater surface area for electrical connection. In this example, the lateral dimension of the exposed top surface 205b substantially corresponds to an inner width "D2" of the bottom of the via opening 234. The expanded exposed surface 205b also increases the via angle "θ", making the diameter profile of the via opening 234 more vertical with respect to the top surface 203 of the substrate 202. The term "via angle" refers to an angle between the sidewall 235 of the via opening 234 and the top surface 207 of the first dielectric layer 210. In one implementation, the via angle "θ" is about 55° to about 75°, for example about 59.7°. In addition, the expanded exposed surface 205b also increases the ratio of the inner width "D2" to an inner width "D1" of the top of the via opening 234. For example, D2/D1 has been observed to increase from less than about 33% to greater than 33% after the post-etch treatment.

At operation 118, the semiconductor device 200 may be cleaned using any suitable wet cleaning process. For example, the wet cleaning process may use an alkaline-based solution, an acid-based solution, or any other suitable solution or solvent that can effectively remove unwanted residues or polymers from the semiconductor device 200. The wet cleaning process may remove a portion or entirety of the barrier layer 236. In some cases, the wet cleaning process removes a portion of the barrier layer 236 disposed at the bottom of the via opening 234 and majority of the barrier layer 236 on the sidewall 235 of the via opening 234. The mask layer 218 may then be removed from the semiconductor device 200 before or after the wet cleaning process.

Figure 4:
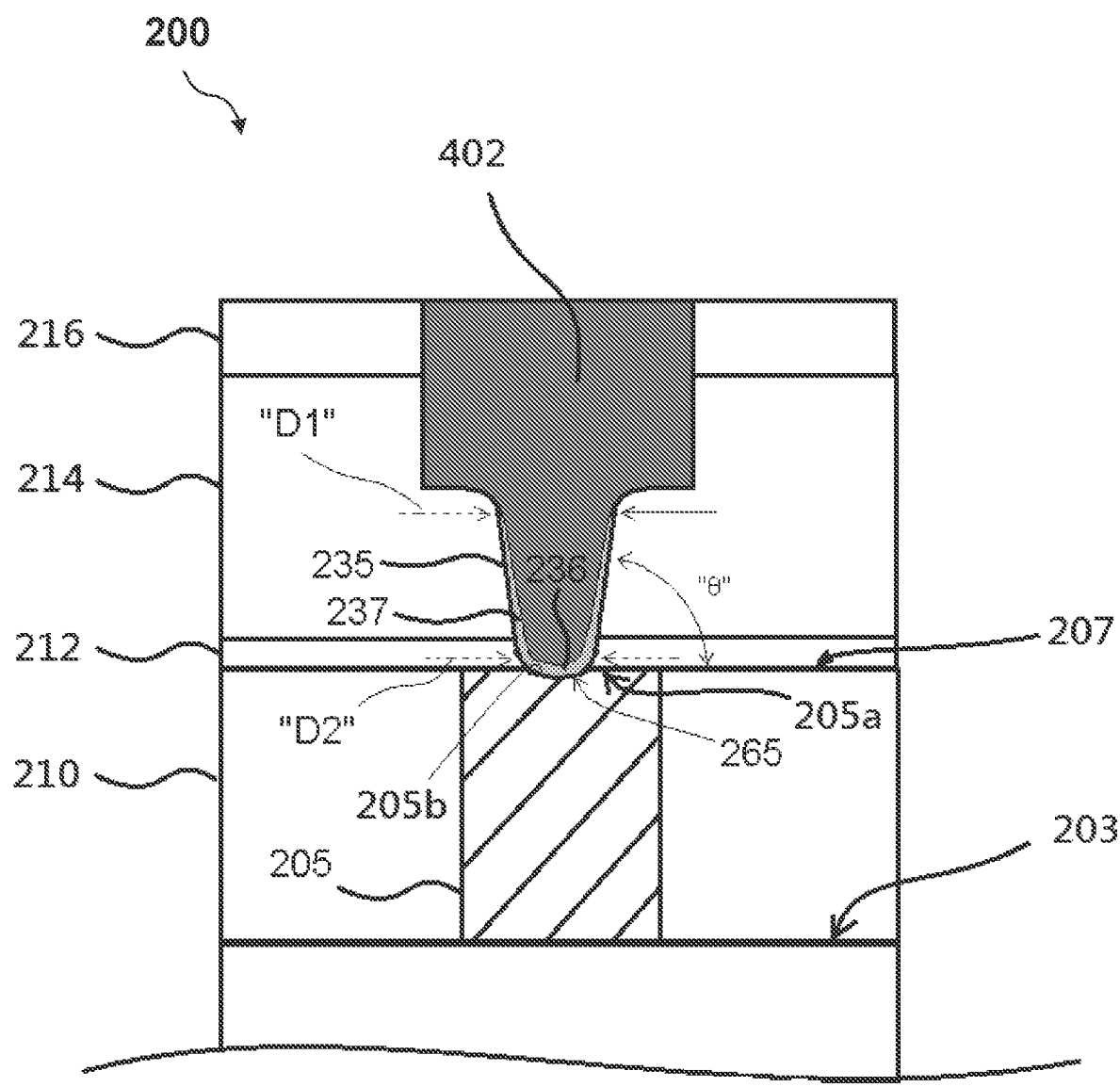
FIG. 4 illustrates an enlarged cross-sectional view of a semiconductor device having via openings and trench openings filled with a conductive material according to various implementations of the present disclosure.

Once the semiconductor device 200 is cleaned, the semiconductor device may be subjected to additional processes, such as a metallization process which may be required to make a multi-level interconnect structure. For example, various via openings 234 and the trench openings 232 may be filled with a conductive material 402, which can be copper or any material discussed above with respect to the electrically conductive feature 205. These via openings 234 and trench openings 232 filled with the conductive material serve as conducting paths for connecting to other devices in the multi-level interconnect structure. FIG. 4 illustrates an enlarged cross-sectional view of the semiconductor device 200 having via openings 234 and trench openings 232 filled with a conductive material 402. As can be seen, a portion of the barrier layer 236 disposed at the bottom of the via opening 234 and majority of the barrier layer 236 on the sidewall 235 of the via opening 234 have been removed by the previous wet cleaning process. Thus, the barrier layer 236 is generally thinner in thickness than it was before the wet cleaning process. The thinner barrier layer 236 prevents unwanted diffusion of copper or other conductive material into adjacent layers.

Implementations of the present disclosure provide a post-etch treatment process for preventing damage or oxidation of an electrical contact surface for an interconnect structure after via/trench opening formation. The post-etch treatment process includes bombarding the electrical contact surface using a plasma containing a gas mixture. Some of the high energy species formed from the plasma are used to remove etch residues or by-products found on the exposed electrical contact surface. Removal of the etch residues or by-products from the electrical contact surface decreases overall contact resistance of a semiconductor device. Other high energy species are used to bombard a mask layer of the interconnect structure to release reactive species from the mask layer. The released reactive species are re-deposited on the exposed electrical contact surface to form a barrier layer. The newly formed barrier layer protects the underlying electrical contact surface from oxidation. The plasma density and the power voltage can be controlled to change the profile of the via opening and expand the surface area of the electrical contact surface for better electrical connection.

In one embodiment, a method of processing a substrate includes forming an opening in a structure on the substrate to expose a portion of a surface of an electrically conductive feature, and bombarding a surface of a mask layer of the structure using energy species formed from a plasma to release reactive species from the mask layer, wherein the released reactive species form a barrier layer on the exposed surface of the electrically conductive feature.

In another embodiment, a method of processing a substrate includes forming a first dielectric layer over the substrate, the first dielectric layer having a trench containing an electrically conductive feature, forming a second dielectric layer over the first dielectric layer, forming a mask layer over the second dielectric layer, forming an opening in the mask layer and the second dielectric layer to expose a surface of the electrically conductive feature, forming a plasma having a first gas and a second gas, and bombarding the mask layer using energy species from at least one of the first gas and the second gas to release reactive species from the mask layer, wherein the released reactive species form a barrier layer on the exposed surface of the electrically conductive feature and sidewall of the opening.

In yet another embodiment, a semiconductor device includes a substrate including a first dielectric layer and an electrically conductive feature in the first dielectric layer, a second dielectric layer over the first dielectric layer, and an interconnect structure in the second dielectric layer and electrically coupled to the electrically conductive feature, the interconnect structure including a barrier layer and a conductive fill, the barrier layer being interposed between the conductive fill and the second dielectric layer, the interconnect structure including a line and a via extending from the line to the electrically conductive feature, wherein the via has a sidewall and a bottom, and a ratio of an inner width of the bottom of the via to an inner width of a top of the via is greater than about 33%.

In yet another embodiment, a semiconductor device includes a substrate, a semiconductor device includes a first dielectric layer on the substrate, a first conductive feature extending through the first dielectric layer, an etch stop layer (ESL) over the first dielectric layer and the first conductive feature, a second dielectric layer on the ESL, and a second conductive feature extending through the second dielectric layer and into the ESL, the second conductive feature including a barrier layer disposed between the first conductive feature and the second conductive feature, a first portion of the barrier layer covering a bottom surface of the second conductive feature, a second portion of the barrier layer covering lower sidewalls of the second conductive feature, a ratio of a first thickness of the first portion to a second thickness of the second portion being in a range of 1:0.01 to 1:0.3.

In yet another embodiment, a semiconductor device includes a substrate, a conductive feature on the substrate, a first dielectric layer surrounding the conductive feature, a second dielectric layer over the conductive feature and the first dielectric layer, an etch stop layer (ESL) between the first dielectric layer and the second dielectric layer, and a multi-level interconnect structure in the second dielectric layer and in the ESL, the multi-level interconnect structure including a line and a via extending from the line towards the conductive feature, the via fully containing a barrier layer, the barrier layer physically contacting a top surface of the conductive feature, the barrier layer including a transition metal nitride.

In yet another embodiment, a method of manufacturing a semiconductor structure includes: forming an opening through a mask layer, the opening exposing a surface of a conductive feature; forming a plasma; and bombarding a surface of the mask layer using energy species from the plasma to release reactive species from the mask layer and using the energy species to remove residues or by-products on the surface of the conductive feature.

In yet another embodiment, a method of manufacturing a semiconductor structure includes: removing residues on a portion of a conductive feature by reacting energy species with the residues, wherein the portion of the conductive feature is exposed through an opening in a dielectric layer on the conductive feature; and forming a barrier layer on the portion of the conductive feature, forming the barrier layer including bombarding a mask layer on the dielectric layer, bombarding the mask layer forming reactive species, the reactive species being deposited on the portion of the conductive feature.

In yet another embodiment, a method of manufacturing a semiconductor structure includes: forming an etch stop layer (ESL) over respective top surfaces of a conductive feature and a first dielectric layer; depositing a second dielectric layer over the first dielectric layer; forming a transition metal compound over the second dielectric layer; exposing a top surface of the conductive feature by forming an opening through the transition metal compound and the second dielectric layer; removing residues from the top surface of the conductive feature with energy species from a plasma; forming a barrier layer on the top surface of the conductive feature and on a sidewall of the opening, wherein forming the barrier layer includes releasing reactive species from the transitional metal compound by bombarding the transition metal compound with the energy species; and filling the opening with a conductive material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor structure, the method comprising:
    forming an opening through a mask layer, the opening exposing a surface of a conductive feature;
    after forming the opening, forming a plasma; and
    after forming the opening, bombarding a surface of the mask layer using energy species from the plasma to release reactive species from the mask layer and using the energy species from the plasma to remove residues or by-products on the surface of the conductive feature.

2. The method of claim 1, wherein the energy species comprise a first species from an inert gas and a second species from an etchant gas.

3. The method of claim 2, wherein the first species release the reactive species from the mask layer.

4. The method of claim 2, wherein the second species removes the residues or by-products on the surface of the conductive feature.

5. The method of claim 1, wherein the reactive species form a barrier layer on the surface of the conductive feature.

6. The method of claim 5, further comprising performing a wet cleaning process, wherein a portion of the barrier layer remains after the wet cleaning process.

7. The method of claim 6, further comprising filling the opening with a conductive material, wherein the portion of the barrier layer is covered by the conductive material.

8. A method of manufacturing a semiconductor structure, the method comprising:
    removing residues on a portion of a conductive feature by reacting energy species with the residues, wherein the portion of the conductive feature is exposed through an opening in a dielectric layer on the conductive feature; and
    forming a barrier layer on the portion of the conductive feature, forming the barrier layer comprising bombarding a mask layer on the dielectric layer, bombarding the mask layer forming reactive species, the reactive species being deposited on the portion of the conductive feature, wherein removing the residues and forming the barrier layer are performed simultaneously.

9. The method of claim 8, wherein the residues comprise fluorine.

10. The method of claim 8, wherein the reactive species comprise a transition metal.

11. The method of claim 8, wherein the energy species are formed by ionizing an etchant gas.

12. The method of claim 8, wherein bombarding the mask layer comprises ionizing an inert gas and applying a bias power.

13. The method of claim 12, wherein the bias power is applied at a radio frequency range of 10 MHz to 30 MHz.

14. A method of manufacturing a semiconductor structure, the method comprising:
    forming an etch stop layer (ESL) over respective top surfaces of a conductive feature and a first dielectric layer;
    depositing a second dielectric layer over the first dielectric layer;
    forming a transition metal compound over the second dielectric layer;
    exposing a top surface of the conductive feature by forming an opening through the transition metal compound and the second dielectric layer;
    removing residues from the top surface of the conductive feature with energy species from a plasma;
    forming a conductive barrier layer on the top surface of the conductive feature and on a sidewall of the opening, wherein forming the conductive barrier layer comprises releasing reactive species from the transition metal compound by bombarding the transition metal compound with the energy species from the plasma, wherein the reactive species released from the transition metal compound reacts with a species in the plasma to form the conductive barrier layer; and
    filling the opening with a conductive material.

15. The method of claim 14, wherein the opening has a concave bottom after forming the conductive barrier layer.

16. The method of claim 14, wherein the opening has a convex bottom after forming the conductive barrier layer.

17. The method of claim 14, further comprising trimming the second dielectric layer, wherein trimming the second dielectric layer changes a rough profile of the opening to a smooth and rounded profile.

18. The method of claim 14, wherein the reactive species comprise titanium and nitrogen.

19. The method of claim 14, further comprising performing a wet cleaning process, wherein the wet cleaning process removes a portion of the conductive barrier layer on a bottom of the opening, wherein the wet cleaning process removes a majority of the conductive barrier layer on the sidewall of the opening.

20. The method of claim 5, wherein the barrier layer is conductive.

\* \* \* \* \*